United States Patent
Heyne et al.

(10) Patent No.: US 6,469,563 B2
(45) Date of Patent: Oct. 22, 2002

(54) CIRCUIT CONFIGURATION FOR COMPENSATING RUNTIME AND PULSE-DUTY-FACTOR DIFFERENCES BETWEEN TWO INPUT SIGNALS

(75) Inventors: Patrick Heyne; Thoai-Thai Le, both of München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/865,752

(22) Filed: May 25, 2001

(65) Prior Publication Data

US 2002/0021155 A1 Feb. 21, 2002

(30) Foreign Application Priority Data

May 25, 2000 (DE) .......................... 100 26 079

(51) Int. Cl.[7] .............................. G06G 7/12; H03K 3/00
(52) U.S. Cl. ....................................... 327/362; 327/175
(58) Field of Search ................................ 327/108, 175, 327/407, 408, 362, 172

(56) References Cited

U.S. PATENT DOCUMENTS

| 5,144,156 A | | 9/1992 | Kawasaki | 327/157 |
| 5,546,035 A | * | 8/1996 | Okamoto | 327/208 |
| 6,052,035 A | | 4/2000 | Nolan et al. | 331/74 |
| 6,255,867 B1 | * | 7/2001 | Chen | 327/108 |

* cited by examiner

*Primary Examiner*—Dinh T. Le
(74) *Attorney, Agent, or Firm*—Laurence A. Greenberg; Werner H. Stemer; Ralph E. Locher

(57) ABSTRACT

The circuit configuration compensates runtime and pulse-duty-factor differences of two input signals having approximately equal frequency and phase. For each input signal respectively present at an input of the circuit configuration, a signal path is provided that, dependent on the state of the output, is influenced in such a way that the output signal follows the input signal that changes first. A feedback branch with a time-delay element feeds back the output signal to the inputs with a delay, in such a way that these inputs are prepared for the next change of input signal. The delay time of the time-delay element is greater than the maximum chronological deviation between the two input signals.

5 Claims, 3 Drawing Sheets

CIRCUIT CONFIGURATION FOR COMPENSATING RUNTIME AND PULSE-DUTY-FACTOR DIFFERENCES BETWEEN TWO INPUT SIGNALS

BACKGROUND OF THE INVENTION

Field of the Invention

The invention relates to a circuit configuration for compensating runtime and pulse-duty-factor differences of two input signals of approximately equal frequency and phase, whereby for each input signal respectively present at an input of the circuit configuration, a signal path is provided that, dependent on the state of the output, is influenced in such a way that the output signal follows the input signal that changes first.

In integrated semiconductor circuits, in particular memory circuits, the problem arises that in particular clock signals must be distributed to a plurality of sections of the semiconductor circuit, for example to a plurality of memory banks of an integrated memory circuit. In what is known as a clock distribution tree, runtime and pulse-duty-factor differences between the distributed signals can thereby arise, above all through the driver stage, as well as through the respective load.

FIG. 1 shows a prior art circuit configuration previously used for compensating runtime and pulse-duty-factor errors between two input signals. That circuit configuration has in principle two signal paths that are enabled or blocked in dependence on the state of the outputs. Each signal path respectively comprises a JK flip-flop 20, 30 and logic elements 21, 22, 23 and 31, 32 and 33. The output states at the Q outputs of JK flip-flops 20 and 30 are respectively supplied to a J- and to a K- input of an additional JK flip-flop 40, whose Q output forms an output terminal OUT of the circuit configuration. the output states of the JK flip-flop 40 are fed back to reset terminals R of the JK flip-flops 20 and 30 of the two signal paths. In this way, the signal paths are enabled or blocked, dependent on the output state of the JK flip-flop 40.

The circuit configuration shown in FIG. 1 realizes the following truth table:

| IN1 | IN2 | OUT$^T$ | OUT |
|-----|-----|---------|-----|
| 0   | 0   | 0       | 0   |
| 0   | X   | 1       | 0   |
| X   | 0   | 1       | 0   |
| 1   | 1   | 1       | 1   |
| 1   | X   | 0       | 1   |
| X   | 1   | 0       | 1   |

Here, OUT$^T$ indicates the previous output state of JK flip-flop 40.

Disadvantages of the previously standard circuit configuration shown in FIG. 1 are the relatively high circuit outlay, the relatively large chip surface occupied by the circuit, and the long runtime of the circuit configuration itself.

SUMMARY OF THE INVENTION

The object of the present invention is to provide a circuit configuration which overcomes the above-noted deficiencies and disadvantages of the prior art devices and methods of this general kind, and which provides for a simplified circuit configuration that realizes the above truth table, and whose output follows the first-changing input signal, and in which the occurrence of transverse current is prevented.

With the above and other objects in view there is provided, in accordance with the invention, a circuit configuration for compensating runtime and pulse-duty-factor differences of two input signals having substantially equal frequency and phase, which comprises:

a first input receiving a first input signal;
a second input receiving a second input signal;
an output for outputting an output signal;
a first signal path from the first input to the output and a second signal path from the second input to the output, wherein the signal path is influenced such that the output signal follows a first-changing input signal; and
a time-delay element connected between the output and the first and second inputs, for a delayed feedback of the output signal, wherein a delay time of the time delay element is such that the first and second inputs are prepared for a next change of the input signal, and the delay time is greater than a maximum chronological deviation between the first and second input signals.

In accordance with an added feature of the invention, the output signal depends on the first and second input signals in accordance with the following truth table:

| IN1 | IN2 | OUT$^T$ | OUT |
|-----|-----|---------|-----|
| 0   | 0   | 0       | 0   |
| 0   | X   | 1       | 0   |
| X   | 0   | 1       | 0   |
| 1   | 1   | 1       | 1   |
| 1   | X   | 0       | 1   |
| X   | 1   | 0       | 1   | whereby OUT$^T$ indicates a previous state of the output signal OUT.

In accordance with an additional feature of the invention, the maximum chronological deviation between the first and second input signals is predetermined by a process selected from the group consisting of measurement, simulation, and estimation, and the time-delay element is configured for adjusting the delay time.

With the above and other objects in view there is also provided, in accordance with the invention, an integrated semiconductor circuit which comprises a clock distribution tree for distributing a clock signal to a plurality of circuit sections, and at least one circuit configuration according to the above-summarized invention, for compensating runtime and pulse-duty-factor errors of the distributed clock signal.

The integrated semiconductor circuit is a memory circuit in a preferred embodiment, and the circuit sections are memory banks.

In other words, it is a basic premise of the novel circuit configuration to comprise a time-delay element for the delayed feeding back of its output signal to its inputs, in such a way that the inputs are prepared for the next change of signal.

The condition must thereby be maintained that the delay time of the time-delay element is greater than the maximum chronological deviation between the two input signals.

This means that for the correct functioning of the inventive circuit configuration the maximum chronological deviation between the two input signals must be known. It can for example be determined by measurement, and the delay time of the time-delay element can be set, through corresponding adjustment means, greater than the measured maximum chronological deviation between the two input signals.

A circuit configuration of this type can be used with particular advantage in integrated semiconductor circuits, in particular memory circuits.

Other features which are considered as characteristic for the invention are set forth in the appended claims.

Although the invention is illustrated and described herein as embodied in a circuit configuration for compensating runtime and pulse-duty-factor differences between two input signals, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
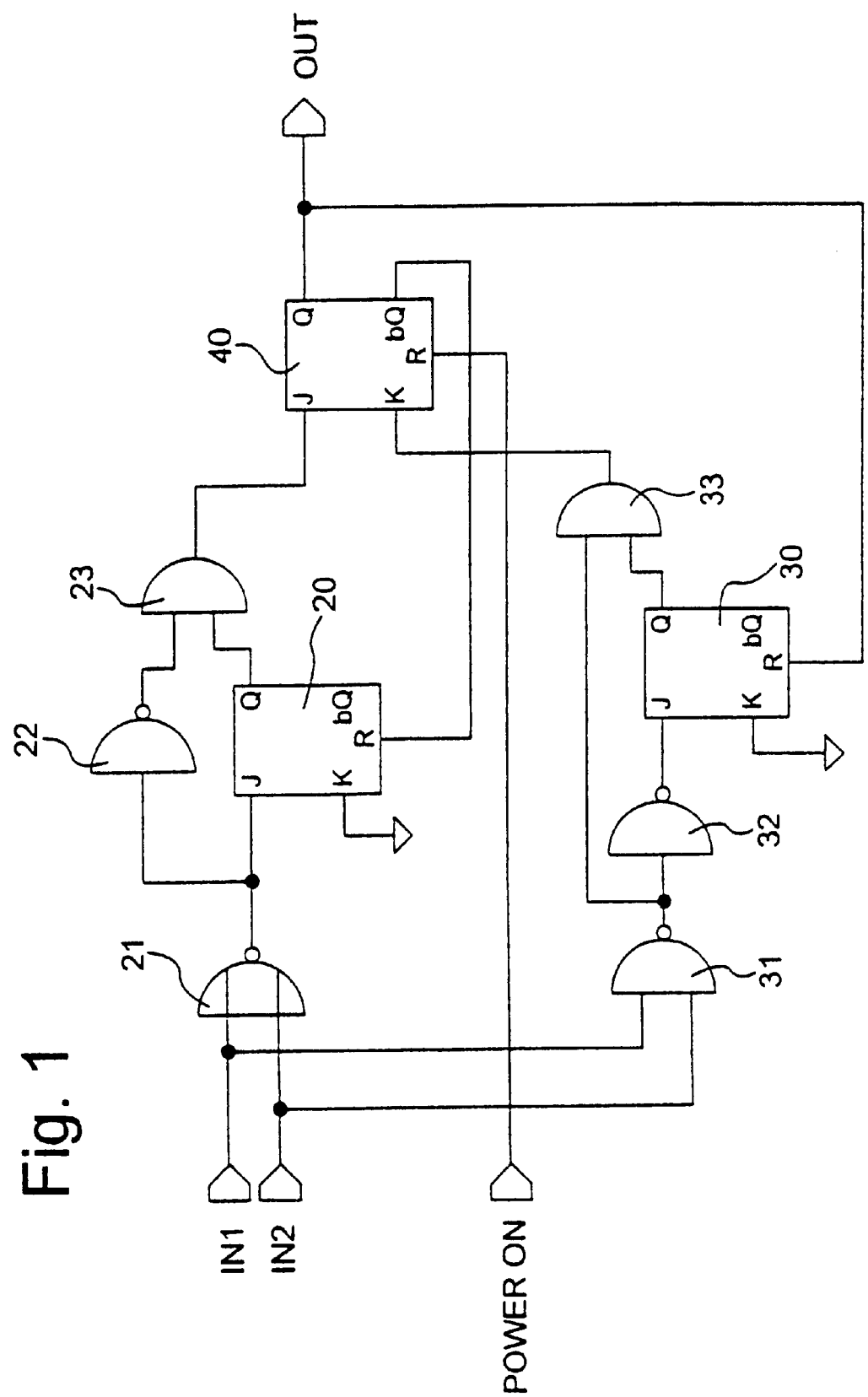
FIG. 1 is a circuit diagram illustration a prior art circuit configuration.
Figure 2:
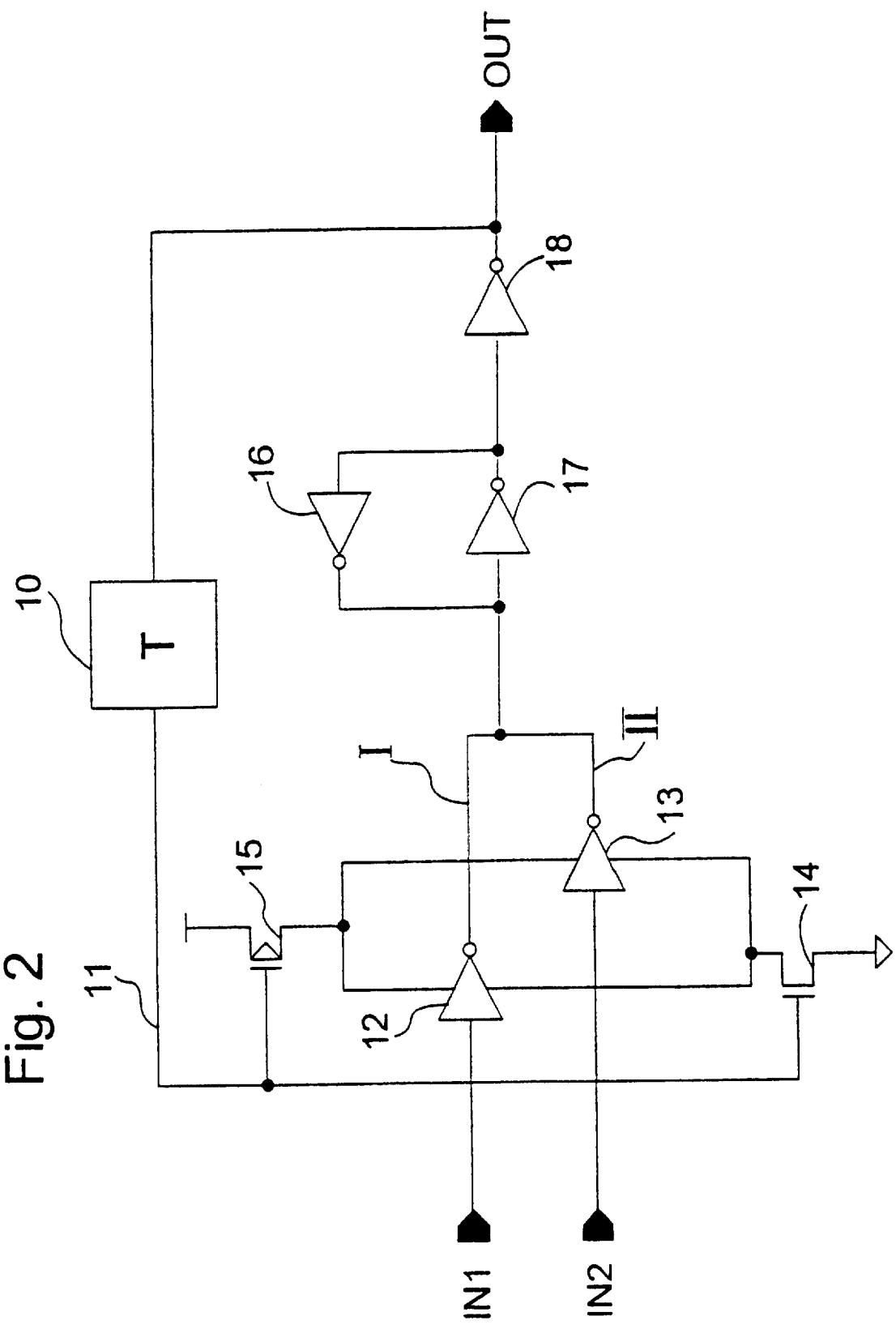
FIG. 2 is a circuit diagram showing a currently preferred exemplary embodiment of an inventive circuit configuration.

Referring now to FIG. 2 in detail, which illustrates a preferred embodiment of the invention, there is seen a circuit that uses a feedback 11, delayed through a time-delay element 10, of the output signal OUT. The feedback 11 is branched back to the circuit inputs. For this purpose, the circuit configuration shown in FIG. 2 comprises a first and second inverting element 12 and 13, whose signal inputs respectively receive input signals IN1 and IN2. The first and second inverting element 12 and 13 are enabled, or blocked, via a first and second MOS transistors 14 and 15, dependent on the output signal OUT, which is delayed on the feedback line 11 through the time-delay element 10 by delay time T. The first and the second inverting element 12 and 13, and the MOS transistors 14 and 15 allocated thereto, thus form a first and second signal path I and II, whereby the outputs of the first and the second inverting element 12 and 13 are connected with one another, and, via a third, fourth, and fifth inverting element 16–18, define the output signal OUT. The latter, as mentioned, is supplied to the time-delay element 10. As indicated, the two MOS transistors 14 and 15 are complementary MOS transistors.

So that the circuit can fulfill its function and can realize the above-indicated truth table, the delay time T of time-delay element 10 must be greater than the maximum chronological deviation between the two input signals. The following time condition must therefore be fulfilled:

$$T > \max\{abs(t_{IN1} - t_{IN2})\}.$$

The maximum chronological deviation between two input signals must accordingly be known, and can for example be determined through measurement, whereupon the delay time T of the time-delay element 10 can be set. The time-delay element can for example be realized by an inverter chain.

The inputs of the circuit shown in FIG. 2 are accordingly prepared for the next following change of signal by the feeding back, delayed by the time T, of output signal OUT by means of time-delay element 10.

The preferred exemplary embodiment, shown in FIG. 2, of an inventive circuit configuration thus realizes the above truth table using simple and space-saving components, and at the same time prevents the occurrence of cross-current.

Through the use of the inventive circuit configuration shown in FIG. 2, it is possible to remove or compensate runtime and pulse-duty-factor errors, occurring due to a driver stage as well as to different loads, between clock signals distributed through a clock distribution tree.

Figure 3:
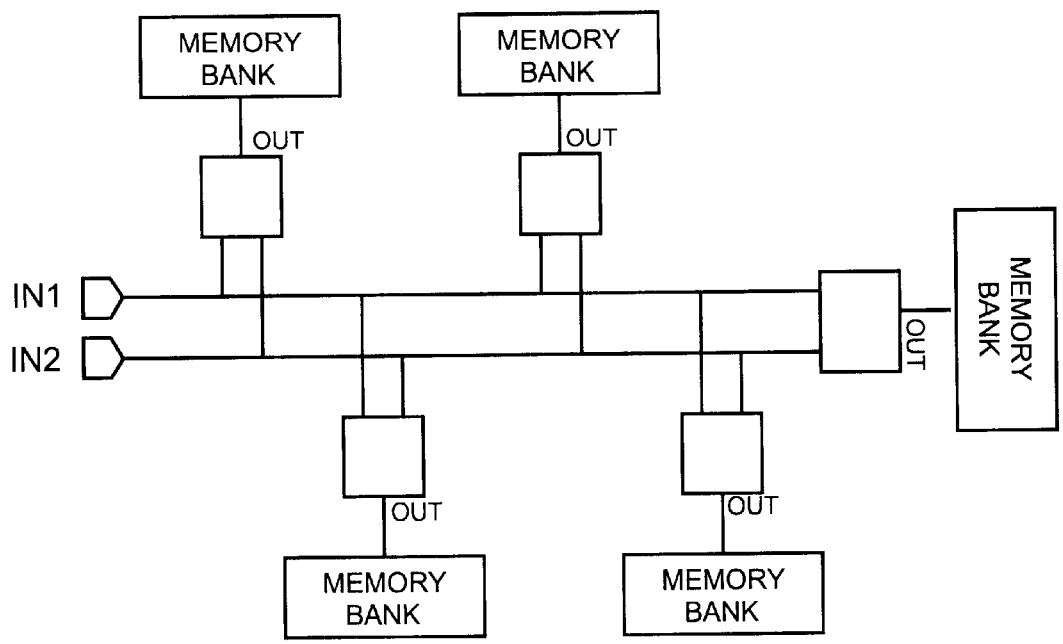
FIG. 3 is a diagrammatic illustration of a clock distribution tree utilizing the novel circuit configuration.

FIG. 3 is a diagrammatic illustration of a clock distribution tree or clock distribution circuit with a plurality of circuit configurations according to the invention. Here, each of the memory banks receives the clock signal from the output signal OUT which is derived in differential fashion from the two inputs IN1, IN2 into the respective local clock driver. The complete circuit is an integrated semiconductor circuit, such as a memory circuit with a plurality of memory banks, and the clock distribution tree distributes a clock signal to the memory banks. The circuit configuration according to the invention, i.e., the subcircuit clock drivers compensate runtime and pulse-duty-factor errors of the distributed clock signal.

We claim:

1. A circuit configuration for compensating runtime and pulse-duty-factor difference of two input signals having substantially equal frequency and phase, which comprises:

a first input receiving a first input signal;

a second input receiving a second input signal;

an output for outputting an output signal;

a first signal path from said first input to said output and a second signal path from said second input to said output, wherein each of said signal paths is influenced such that the output signal follows a first-changing input signal of said input signals; and a time-delay element connected between said output and said first and second inputs, for a delayed feedback of the output signal, wherein a delay time of said time delay element is such that said first and second inputs are prepared for a next change of the input signals, and said delay time is greater than a maximum chronological deviation between the first and second input signals.

2. The circuit configuration according to claim 1, wherein the output signal depends on the first and second input signals in accordance with the following truth table:

| IN1 | IN2 | OUT$^T$ | OUT |
|---|---|---|---|
| 0 | 0 | 0 | 0 |
| 0 | X | 1 | 0 |
| X | 0 | 1 | 0 |
| 1 | 1 | 1 | 1 |
| 1 | X | 0 | 1 |
| X | 1 | 0 | 1 | whereby:

OUT$^T$ indicates a previous state of the output signal OUT;

IN1 indicates said first input signal,

IN2 indicates said second input signal,

OUT indicates said output signal, and

X indicates a later-changing input signal of said first and second input signals.

3. The circuit configuration according to claim 1, wherein the maximum chronological deviation between the first and second input signals is predetermined by a process selected from the group consisting of measurement, simulation, and estimation, and said time-delay element has an adjustable delay time, and said delay time is set to the maximum chronological deviation.

4. An integrated semiconductor circuit, comprising a clock distribution tree for distributing a clock signal to a plurality of circuit sections, and at least one circuit configuration according to claim 1, for compensating runtime and pulse-duty-factor errors of the distributed clock signal.

5. The integrated semiconductor circuit according to claim 4, wherein the circuit is a memory circuit and said circuit sections are memory banks.

* * * * *